United States Patent [19]

Rödde et al.

[11] Patent Number: 5,679,594
[45] Date of Patent: Oct. 21, 1997

[54] METHOD OF FABRICATING A READ ONLY MEMORY IN MOS TECHNOLOGY, AND MEMORY THUS OBTAINED

[75] Inventors: Klaus Rödde, Carquefou; Olivier Le Neel, Le Cellier, both of France

[73] Assignee: Matra MHS, Nantes, France

[21] Appl. No.: 593,788

[22] Filed: Jan. 30, 1996

[30] Foreign Application Priority Data

Feb. 3, 1995 [FR] France .................................. 95 01278

[51] Int. Cl.⁶ .............................................. H01L 21/8246
[52] U.S. Cl. ............................... 437/48; 437/52; 437/45
[58] Field of Search ............................ 437/45, 48, 52; 257/390, 391

[56] References Cited

U.S. PATENT DOCUMENTS

| | | | |
|---|---|---|---|
| 4,074,238 | 2/1978 | Masuda | 257/391 |
| 4,142,176 | 2/1979 | Dozier | 257/391 |
| 4,235,010 | 11/1980 | Kawagoe | 437/48 |
| 4,328,563 | 5/1982 | Schroeder | 437/48 |
| 4,384,345 | 5/1983 | Mikome | 257/390 |
| 4,608,748 | 9/1986 | Noguchi et al. | 257/390 |
| 5,149,667 | 9/1992 | Choi . | |
| 5,332,917 | 7/1994 | Lee et al. | 257/390 |
| 5,470,774 | 11/1995 | Kunitou | 437/52 |

OTHER PUBLICATIONS

Patent Abstracts of Japan, vol. 012 No. 089 (E-592), Mar. 23, 1988 and JP-A-62 224069 (Hitachi Ltd.), Oct. 2, 1987 *abrege*.

Primary Examiner—Chandra Chaudhari
Assistant Examiner—Toniae M. Thomas
Attorney, Agent, or Firm—Larson and Taylor

[57] ABSTRACT

A method of fabricating a read only memory consisting of a matrix of arrays of enhancement-mode or depletion-mode programmed MOS transistors that consists, on a silicon substrate (SU) of a first conduction type, in defining by masking, retrograde wells of the same conduction type as that of the substrate, and then retrograde wells of conduction type opposite to that of the substrate. Removal of the protective oxide allows thus to predefine the enhancement-mode and depletion-mode transistors.

3 Claims, 5 Drawing Sheets

FIG.1. (PRIOR ART)

DEPLETION-MODE TRANSISTOR
(NMOS)

PMOS ENHANCEMENT-MODE TRANSISTOR
EMPLOYED AT THE
PERIPHERY OF THE MATRIX

NMOS ENRICHMENT-MODE TRANSISTOR
EMPLOYED WITHIN THE MEMORY MATRIX

METHOD OF FABRICATING A READ ONLY MEMORY IN MOS TECHNOLOGY, AND MEMORY THUS OBTAINED

FIELD OF THE INVENTION

The invention relates to a method of a fabricating a read only memory of ROM type (Read Only Memory) in MOS technology, and the memory thus obtained.

BACKGROUND OF THE INVENTION

Figure 1:
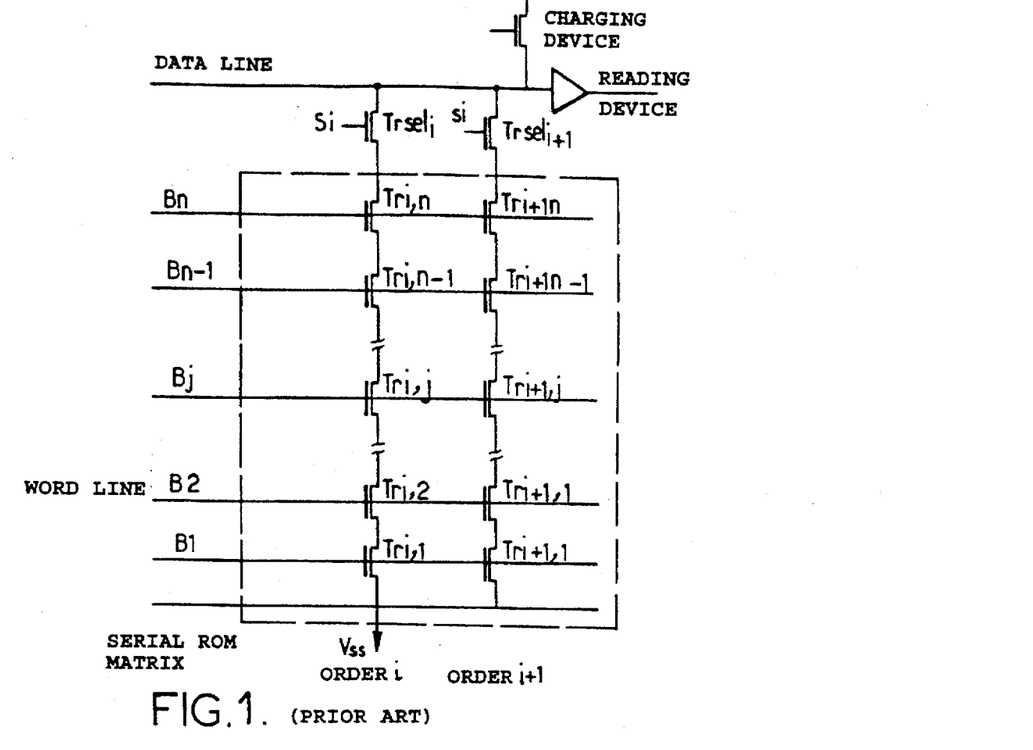

Currently, the architecture allowing the best density of integration of a read only memory in MOS technology comprises, as represented in FIG. 1, a structure of a NAND or serial type, allowing the storing of N words of n bits, by way of a matrix structure with addresses i, j of N×m MOS transistors, denoted $Tr_{i1}$, $Tr_{in}$ with $i \in 1,m$, $j \in 1,m$. As illustrated N transistors $Tr_{i1}$ to $Tr_{in}$ are thus connected in series, with common drain-source electrodes, and form a disabling circuit for disabling bits of like order i for each successive word 1 to m. Each disabling circuit is selected from the corresponding complete matrix, for reading, by means of a selection transistor $Trsel_i$. The programming of a bit of order i, in each word, is performed by way of the threshold voltage Vt of the transistors $Tr_{ij}$, these transistors being configured either as an enhancement-mode transistor, or as a depletion-mode transistor. The selection transistors are enhancement-mode transistors. The reading of the information programmed at the level of a memory point, consisting of a transistor $Tr_{ij}$, is performed as follows:

precharging of the data line to the supply potential Vdd with the aid of a transistor or charging device;

holding of the potential of all the selection lines Sk, k≠i, of the disabling circuits k, k≠i at the reference potential Vss, the selection line Si being connected to the supply potential Vdd;

holding of all the control lines of the gate electrodes of the transistors $Tr_{ij}$, $B_h$, h≠j, at the supply potential Vdd, with the exception of the line $B_j$ which is set to the reference potential Vss. Line $B_j$ controls the gate of the transistor $Tr_{ij}$ and the corresponding memory point. If the aforesaid transistor $Tr_{ij}$ has been programmed as an enhancement-mode transistor, the data line, once precharged, does not discharge, the transistor $Tr_{ij}$ being disabled. A detection circuit, not represented but linked to the data line, records the potential Vdd and delivers a corresponding logic state signal.

If, on the other hand, the transistor $Tr_{ij}$ has been programmed as a depletion-mode transistor, the transistor $Tr_{ij}$ is conducting and the data line discharges across all the transistors in series of like order i, including the selection transistor $Trsel_i$. The detection circuit records a reduction in the potential of the data line and delivers a corresponding logic state signal.

Considering the operation of this type of memory cell, it is noted that it is therefore unnecessary to monitor the threshold voltage of the depletion-mode MOS transistors fully, since it suffices to guarantee a minimum current when the potential applied to the gate $B_j$ is equal to the reference voltage Vss, and consequently it is unnecessary to disable this transistor.

Figure 2A:
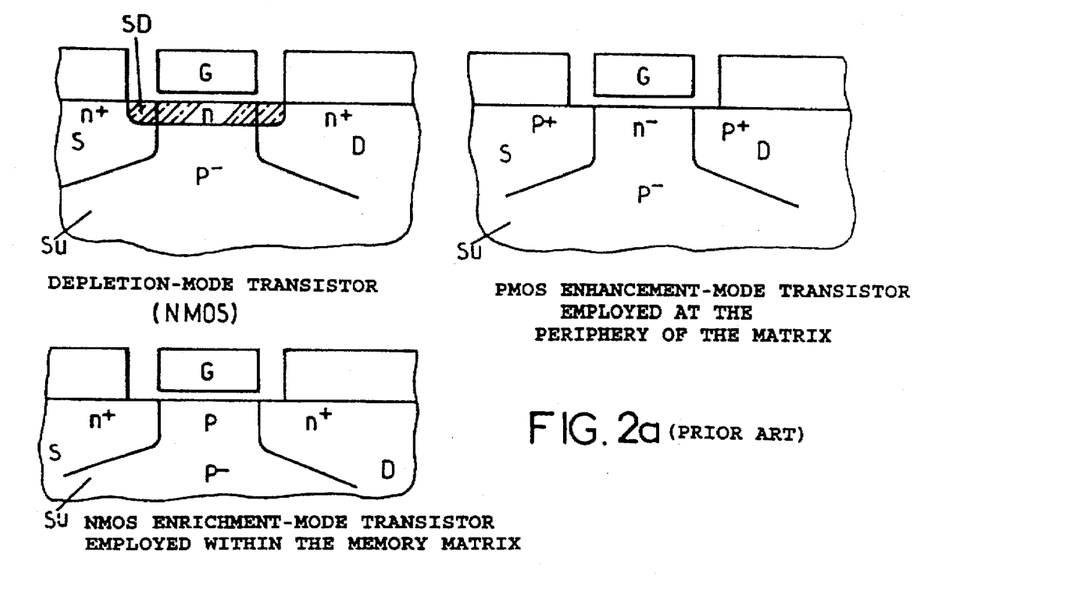

In order to produce this type of component in integrated circuit form, it is therefore necessary to produce, starting from a silicon substrate of P type for example, depletion-mode transistors, enhanced transistors of PMOS or NMOS type, as represented in FIG. 2a. The depletion-mode and enhancement-mode transistors, of NMOS type, are employed in the matrix in order to produce, depending on their programming, the corresponding memory points, whereas the enhancement-mode transistors, of PMOS type, are employed at the periphery of the matrix, to produce the selection transistors for example. In FIG. 2a, the letters S, D, G denote the source, drain and gate regions of these transistors, the letters P, P$^+$, P$^-$ and n, n$^+$, n$^-$ the corresponding conduction types, after doping of the substrate SU. In the depletion-mode transistors, it is recalled that the region SD denotes a region of conduction type n producing a link of low resistance, of the order of 100Ω, equivalent to a short-circuit, between the source region S and drain region D.

Figure 2B:
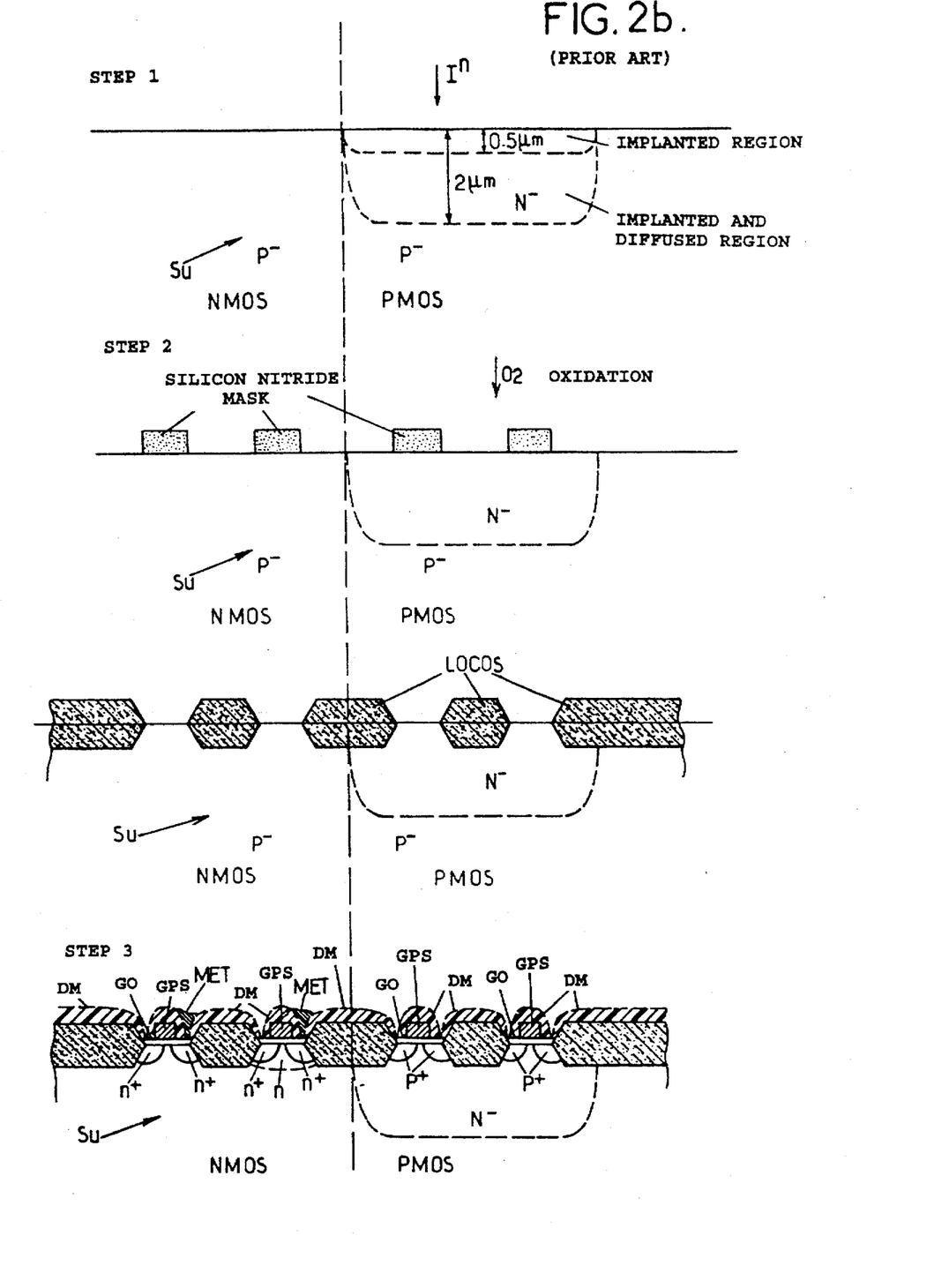

A conventional method for producing corresponding matrices of memory points comprises, as represented in FIG. 2b, in a step 1, starting from a substrate SU of silicon of type P$^-$, in subdividing this substrate into two regions, symbolized by the dashed vertical line, the regions being intended for the creation of PMOS and NMOS transistors, respectively. In the PMOS region, a negative ion implantation with low energy, of the order of 80 keV, is carried out in order to form an implanted region of the order of 0.5 μm and then diffused by heat treatment, at 1000° C. for 24 hours, for example, in order to form a diffused well of N$^-$ type over approximately 2 μm;

in a step 2, a masking by means of a silicon nitride mask is performed in order to define active regions of the PMOS and NMOS transistors, respectively. The masking step is followed by an oxidation step making it possible to obtain thick silicon oxide regions, more commonly designated LOCOS, on the unmasked regions of the surface of the substrate SU. As shown in the third part of FIG. 2b, which is a second view of step 2, after removing the silicon nitride mask, free regions of the surface of the substrate SU exist between the LOCOS regions, on which the respective PMOS and NMOS transistors are subsequently implanted;

in a step 3, illustrated at the bottom of FIG. 2b and more particularly intended for implanting the PMOS and NMOS transistors in which a step of sacrificial oxidation (Kooi oxide) of the free regions of the NMOS part is carried out, for cleaning purposes, followed by a masking and then an n-type implantation represented by dashed lines in the NMOS region, this implantation being intended to constitute the SD region of the NMOS depletion-mode transistors, such as represented in FIG. 2a.

These operations are followed, for all the free regions of the surface of the substrate SU, by a step of gate oxide growth GO, polysilicon deposition and then creation by photolithography of the gate polysilicon regions GPS. Next, on the PMOS and NMOS parts, respectively, the drain region and source region of the NMOS depletion-mode transistors and of the PMOS enhancement-mode transistors are subsequently defined by ion implantation:

n$^+$ NMOS side, n$^+$=10$^{19}$ to 10$^{20}$ cm$^{-3}$ p$^+$ PMOS side, p$^+$=10$^{19}$ to 10$^{20}$ cm$^{-3}$ The steps of depositing a dielectric material DM and then a metallization MET are carried out subsequently in order to produce the appropriate connections.

The method thus implemented makes it possible to produce, by means of different steps, on the one hand, the depletion-mode NMOS transistors and, on the other hand, the enhancement-mode PMOS or NMOS transistors used at the periphery of the matrix.

However, with respect to defining the n-channel of the depletion-mode transistor and of the PMOS transistor, it does not allow a common operation of n-type implantation by virtue of the contamination engendered by this diffusion of the n-well with respect to the neighbouring transistors.

SUMMARY OF THE INVENTION

The object of the present invention is to remedy the drawbacks discussed above by implementing a simplified method.

Another object of the present invention is the implementation of a method of fabricating a read only memory in MOS technology in which certain steps may be grouped together, thus allowing optimization of the conduct of the method.

Another object of the present invention is finally the implementation of MOS memory transistor matrices having specific symmetry characteristics through the implementation of the method, the enhancement-mode and depletion-mode transistors having substantially the same implantation profile.

The method of fabricating a read only memory in MOS technology, which is the subject of the present invention, in which memory an n-bit word is stored by way of arrays of MOS transistors connected in cascade to a data line, each array consisting of either enhancement-mode or depletion-mode programmed MOS transistors, consists, starting from a silicon substrate of a first conduction type, in defining active regions in the substrate by masking, and then in removing the mask and protective oxidation.

It is noteworthy in that the method is concerned with defining by masking, in the substrate, retrograde wells of the same conduction type as the conduction type of the substrate. Retrograde wells of conduction type opposite to that of the substrate, and simultaneously depletion-mode transistors, are also defined by masking. The protective oxide is removed, thus making it possible to predefine the enhancement-mode and depletion-mode transistors, respectively. The substrate is next subjected to the steps of gate oxide growth, of adjustment of the threshold voltages, of defining, respectively the diffusions of opposite conduction type and the same conduction type as the conduction type of the substrate and then of metallization of the connections.

BRIEF DESCRIPTION OF THE DRAWINGS

The invention will be better understood on reading the description and looking at the drawings below, in which, apart from FIGS. 1, 2a and 2b relating to the prior art, and FIG. 2c relating to a partial view of a column of transistors of the matrix, in their implantation, FIG. 3 represents, in the sectional planes of FIG. 2c:

a longitudinal sectional view AA' of the transistors, a transverse sectional view BB' of a depletion-mode transistor, a transverse sectional view CC' of an enhancement-mode transistor, during the step of defining the retrograde wells of conduction type opposite to that of the substrate and the depletion-mode transistors, respectively, during the step of defining the retrograde wells of the same conduction type as that of the substrate and an enhancement-mode transistor;

DETAILED DESCRIPTION OF THE PREFERRED EMBODIMENTS

A more detailed description of the method of fabricating a read only memory in MOS technology, which is the subject of the present invention will now be given in connection with FIG. 2c, relating to the prior art, and FIGS. 3, to 6.

Prior to the description proper, i.e., the basic description of the method which is the subject of the present invention, certain elements and indications relating to the implantation of a matrix of transistors $Tr_{ij}$ forming a memory point of the corresponding read only memory will be given in connection with FIG. 2c, this Figure representing in a plan view the implantation of three consecutive transistors $Tr_{ij}$ of an array of transistors constituting the memory cells of the bits of order i of a plurality of words in the relevant ROM or read only memory. For simplicity, the aforesaid transistors are referenced T1, T2 and T3 in FIG. 2c.

Figure 2C:
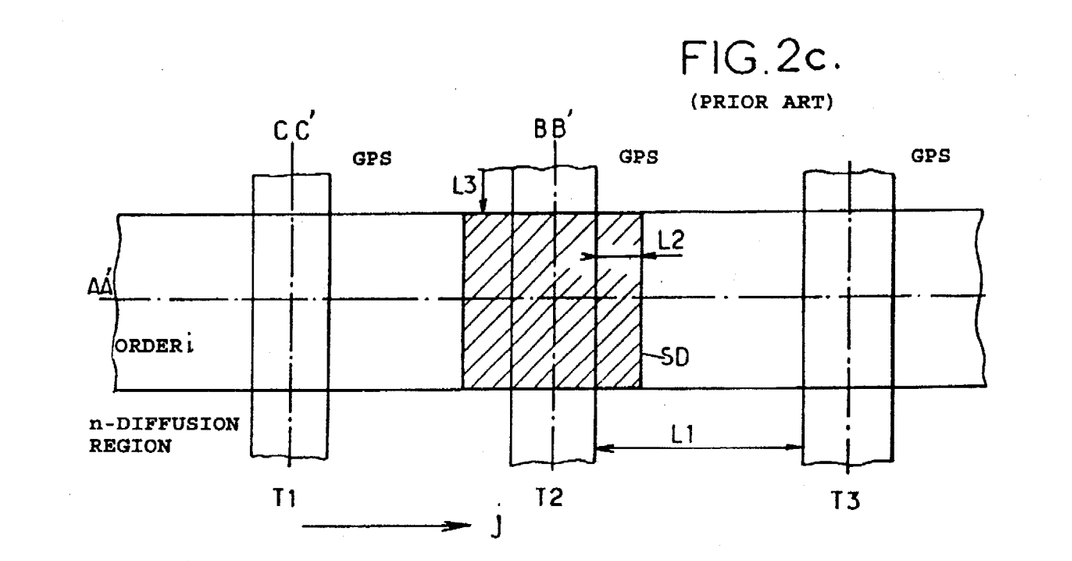

In FIG. 2c, it is indicated that the transistors T1 and T3 are, for example, enhanced transistors, of NMOS type, whereas the transistor T2 is a depletion-mode transistor, likewise of NMOS type. These transistors are produced on a P-type substrate in which an N-type diffused well has been made, this N-type well being represented by the n-diffusion region in FIG. 2c. Each NMOS type enhancement-mode transistor, T1 and T3, is therefore furnished with a structure similar to that represented in FIG. 2a. Thus, each of them essentially comprises a gate region formed by a region made of polysilicon, denoted GPS, which is transverse to the n-diffusion region mentioned earlier.

As regards the depletion-mode transistor T2, it is indicated that the latter naturally includes the same gate polysilicon region GPS in order to form an NMOS type depletion-mode transistor, such as represented in FIG. 2a. Furthermore, as represented by the hatched region in FIG. 2c relating to the depletion-mode transistor T2, the latter comprises a so-called vignette or pattern region making it possible to define the aforesaid depletion-mode transistor T2, this region, denoted SD, corresponding to the corresponding region SD such as represented for the depletion-mode transistor in FIG. 2a.

In FIG. 2c, by convention, it is indicated that:

the dashed line AA' denotes the trace of a sectional plane in the lengthwise direction of the transistors T1, T2, T3, the line BB' represents the trace of a sectional plane in the widthwise direction of the depletion-mode transistor T2, the line CC' represents the trace of a sectional plane in the widthwise direction transverse to the enhanced transistors T1 or T3. It is of course indicated that the aforesaid sectional planes are orthogonal to the surface of the substrate.

In general, it is indicated that the method, which is the subject of the present invention, consists, in the course of prior steps, starting from a substrate of semiconductor material such as P-type silicon for example, in carrying out a step of defining n and p active regions through masking operations by means of a silicon nitride mask, this operation of defining the regions being followed by an operation of localized oxidation, and then removal of the mask, and finally sacrificial oxidation of Kooi type.

These operations correspond to operations of conventional type for the production of ROM type read only memories in MOS technology and, in this respect, they will not be described in detail. It is merely indicated that the step consisting in defining the n and p active regions makes it possible to obtain the n-diffusion regions on the substrate, such as are represented in FIG. 2c for example. The obtaining of these regions then allows the implementation of the method, which is the subject of the present invention, for producing programmed transistors, of the depletion-mode or enhancement-mode type, in order to construct the transistor arrays such as represented in FIG. 1. In the embodiment described, it is indicated that the enhancement-mode transistors T1, T3 are NMOS type transistors, whilst the depletion-mode transistor T2 is likewise an NMOS type transistor. These transistors are therefore intended for constructing the transistor arrays such as represented in FIG. 1, so as to construct the aforesaid address matrix ij. As regards the selection transistors, for example, these transistors being arranged outside of the matrix proper, they are constructed in the form of PMOS type enhancement-mode transistors.

Figure 3:
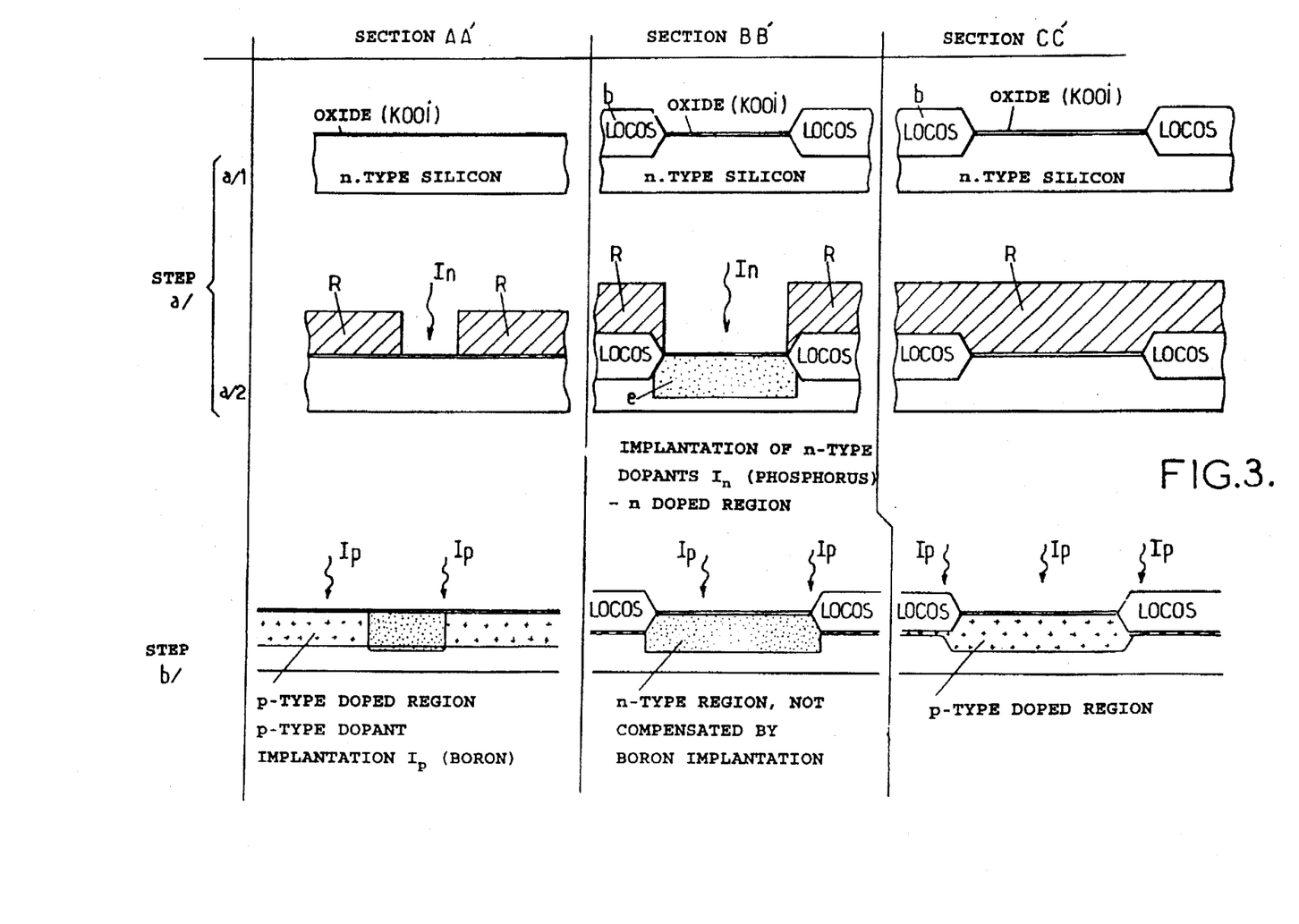

Subsequent to the aforesaid prior steps, the method, which is the subject of the present invention, such as represented in FIG. 3, consists, in a particularly advantageous manner, in a step a), in defining by masking, in the substrate SU, retrograde wells of the same conduction type as the conduction type of the substrate.

The aforesaid step a) can then be followed by a step b) consisting in defining by masking, in the substrate, retrograde wells of conduction type opposite to that of the substrate SU. This step also consists in simultaneously defining depletion-mode transistors.

Generally, it is indicated that the order of the steps a) and b) can be reversed, the defining of the retrograde wells of conduction type opposite to that of the substrate and the simultaneous defining of the depletion-mode transistors being carried out prior to the defining by masking of retrograde wells of the same conduction type as the conduction type of the substrate.

Represented in FIG. 3 is the operation a) consisting in producing retrograde wells of type n, the substrate of type P having been doped to obtain a substrate of type P⁻.

FIG. 3 shows the views in the sectional planes AA', BB', CC' of FIG. 2c during the implementation in a step a1) of a process of masking by means of a photosensitive resin R, represented as a2), a dopant implantation, denoted In, is performed, this implantation being performed on the basis of a dopant of type n such as phosphorus, so as to form a doped region forming a retrograde well of type n, obtained by an operation known as n-well masking. The n-type retrograde wells region is represented in the section BB', this region being intended to produce the vignette or region SD of the NMOS type depletion-mode transistor T2. On the other hand, the transistors T1 and T3 are devoid of any such implantation of retrograde wells by virtue of the presence, as shown in the section CC' of FIG. 3, of the resin mask R over the whole of the corresponding region.

The step of defining the retrograde wells of the same conduction type as the conduction type of the substrate is then followed, as represented in FIG. 3 with respect to the same sections AA', BB' and CC', subsequent to the lifting-off of the resin mask R, by a step of defining, in the substrate, retrograde wells of conduction type opposite to the substrate and simultaneously of defining the depletion-mode transistors. This step corresponding to the aforesaid step b) is represented in the sections AA', BB' and CC' of FIG. 3. It is performed by implantation of P-type dopant, denoted IP, the dopant used being for example boron. This implantation is performed in such a way as to produce, in respect of the initial n-type diffusion region, a P-type doped region in respect of the enhancement-mode NMOS type transistors T1 and T3, as represented in the sections AA' and CC', while in the vignette region SD of the depletion-mode transistor T2, the previously implanted n-type region, the aforesaid P-type implantation remains superficial, the region underlying this superficial region being a region which is not compensated by the implantation of boron, and which therefore is an n-type region.

The aforesaid step, represented in FIG. 3, is then followed by conventional steps such as the removal of the protective oxide, a step of growing a gate oxide, of threshold voltage adjustment, and then of deposition defining gates so as to construct the polysilicon regions GPS. The successive steps of implanting the contact lands and n-diffusion regions so as to construct the NMOS type transistors intended to form the enhancement-mode or depletion-mode NMOS transistors, and then of defining the diffusion regions by PMOS masking so as to construct the PMOS type enhancement-mode transistors intended to form the selection transistors (for example), are then performed in a conventional manner.

These steps of NMOS and PMOS masking are themselves followed by steps of inter-polymetallic insulation, defining of contacts, and then depositing of a first metal and defining of the lines of metal, metal 1, passivation, defining of the openings of the lands and lastly final annealing.

Figure 4:
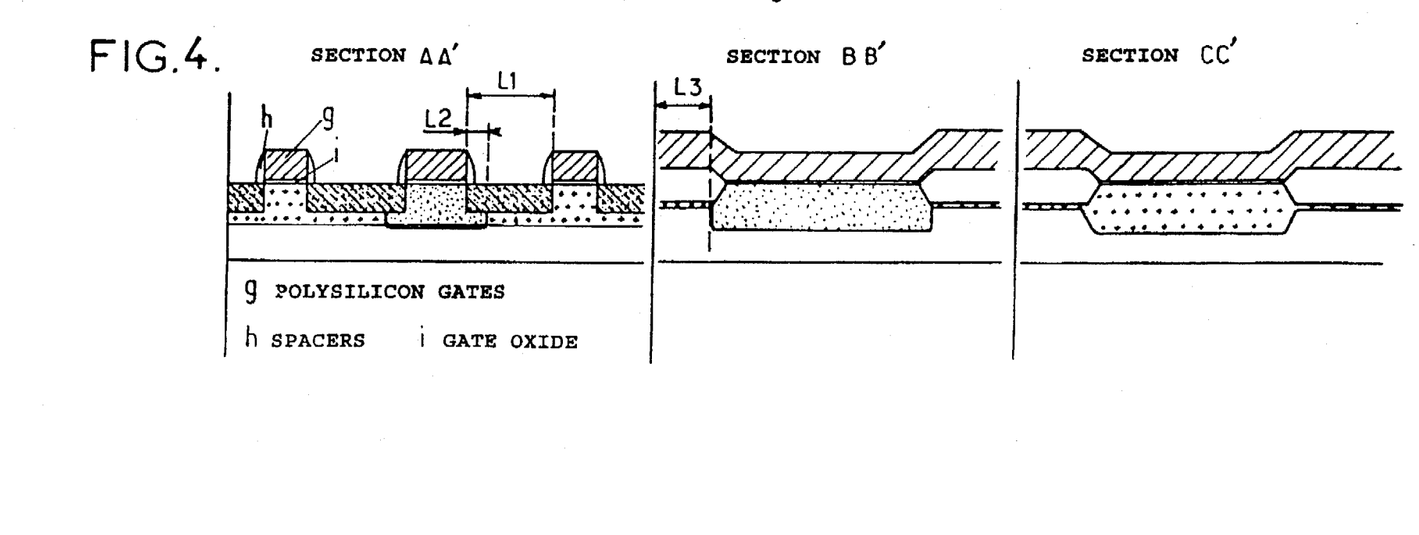
FIG. 4 represents the aforesaid sectional views AA', BB' and CC', in the final step of defining the electrical contacts with a view to a metallization operation.

Represented in FIG. 4 are the steps of defining the P-type diffusions so as to produce the PMOS type transistors by PMOS masking and of inter-polymetal insulation subsequent to the creation of the gate polysilicon regions GPS, and then of spacers denoted h, on and in the vicinity of, the gate oxide denoted and corresponding to gate oxide GO of FIG. 2b.

Generally, it is indicated that the method, which is the subject of the present invention, implements a technology of double retrograde wells obtained after defining the diffusion regions by localized oxidation. The retrograde wells are obtained by a double high-energy ion implantation in a single masking step, masked n-well implantation, full field p-well implantation. The implantation ions are subjected, in accordance with a particular aspect of the method, which is the subject of the present invention, to an energy of between 300 and 500 keV. The implantation is carried out using a conventional implantation device of the ion gun type, which, in this respect, will not be described.

Contrary to the prior art described in connection with FIGS. 2a and 2b, the retrograde wells thus obtained are not diffused at all, since they are defined directly depthwise by virtue of the high implantation energy used.

The other steps of the method which is the subject of the present invention are, by contrast, conventional, such as adjustment of threshold voltage, of gate oxide, of creation of the gate polysilicon regions as well as the creation of the drain-source and interconnection regions.

As regards the fabrication of the depletion-mode transistors, such as the transistor T2 in FIG. 3, in accordance with the method which is the subject of the present invention, these transistors are defined at the same time as the wells of conduction type opposite to the conduction type of the substrate, as described earlier. This mode of operation then makes it possible to define an n-type region in the channel of an NMOS transistor, that is to say to construct the vignette SD enabling the threshold voltage of the transistor to be brought down below the 0 volts value, thus rendering this transistor normally conducting.

The method, which is the subject of the present invention, makes it possible not to add any special step for defining the depletion-mode transistors.

Furthermore, by virtue of the fact that the retrograde wells are not diffused at all, this mode of operation engenders no drop in density of integration, the distances L1, p1p1 in the read only memory and distances L3, n⁺n⁺ are not affected.

The method, which is the subject of the present invention, is also applicable in the same manner starting from an n-type substrate and a p-type retrograde well. In such a case, however, the depletion-mode transistors do not necessitate the implantation of retrograde wells of P⁻ type.

The method, which is the subject of the present invention, also makes it possible to produce PMOS type enhancement-mode transistors such as represented in FIG. 2a, this type of transistor being used at the periphery of the matrix of memory points.

To produce these transistors, in accordance with the implementation of the method, which is the subject of the present invention, these PMOS type enhancement-mode transistors may be produced simultaneously with the production of the depletion-mode transistors.

In this case, the steps for implementing the method such as described earlier, both for the depletion-mode transistors and for the PMOS enhancement-mode transistors, are substantially identical, except, of course, as regards the steps of creating the source region and drain region. These steps involve an implantation of dopant of opposite conduction type, by ion implantation.

Thus, with respect to the creation of NMOS type depletion-mode transistors, as described earlier, conduction regions of type N⁺ opposite to the conduction type of the substrate, are implanted, by masking, in the well of type n, conduction type opposite to that of the substrate of type P⁻, in order to create the source region and drain region, with the n-type retrograde well acting as a channel, i.e., as "vignette" SD as described earlier.

On the other hand, with respect to the simultaneous creation of the PMOS type enhancement-mode transistors, the implantation of source region and drain region SD is carried out by means of a dopant of type P⁺ in the n-type retrograde well, thereby making it possible to produce the aforesaid PMOS type enhancement-mode transistors. It is, of course, understood that the feature of simultaneity of creation of the NMOS type depletion-mode transistors and PMOS type enhancement-mode transistors relates to all the steps prior to the implantation of the aforesaid source region and drain region. It will be recalled, in fact, that, owing to the implantation of type N⁺ in respect of the source region and drain region of the depletion-mode transistors, the n-type conduction region of the retrograde well acts with respect to the aforesaid source region and drain region as a short-circuit on the other hand, in the case of an implantation of type P⁺ in heating the source region and drain region of the enhancement-mode PMOS transistors, the n-type conduction region, created beforehand, of the retrograde well acts as an insulator with regard to the substrate P⁻ with respect to the aforesaid source region and drain region.

Figure 5:
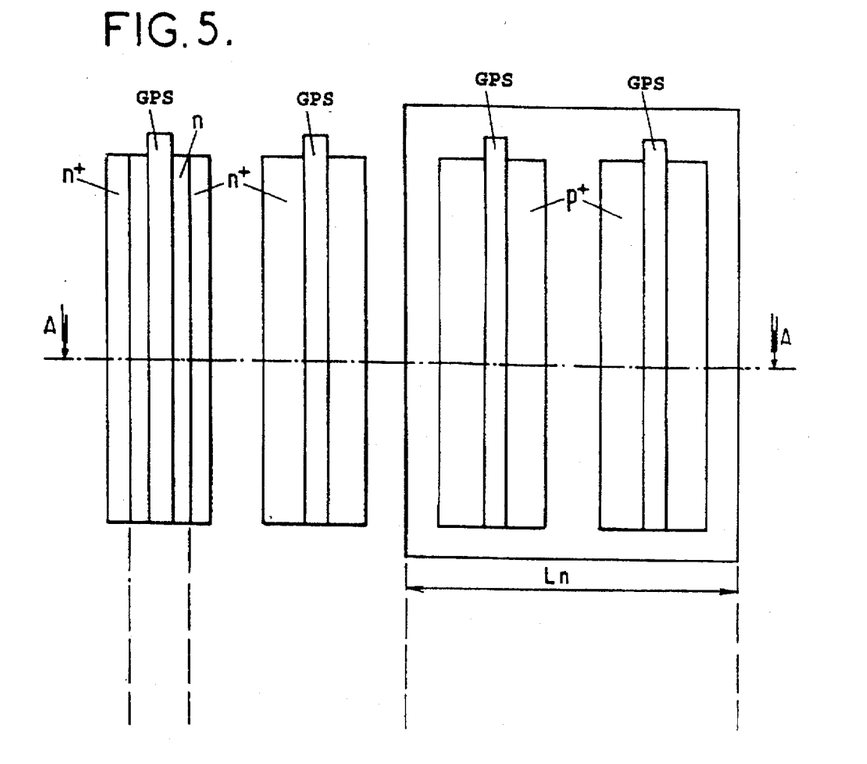
FIG. 5 represents a plan view of a matrix element obtained by implementing the method according to the invention and, FIG. 6 represents a sectional view in the section plane AA of FIG. 5, in particular the symmetrical structure of the depletion-mode and enhancement-mode transistors, a structure obtained by reason of the implementation of the method which is the subject of the present invention.
Figure 6:
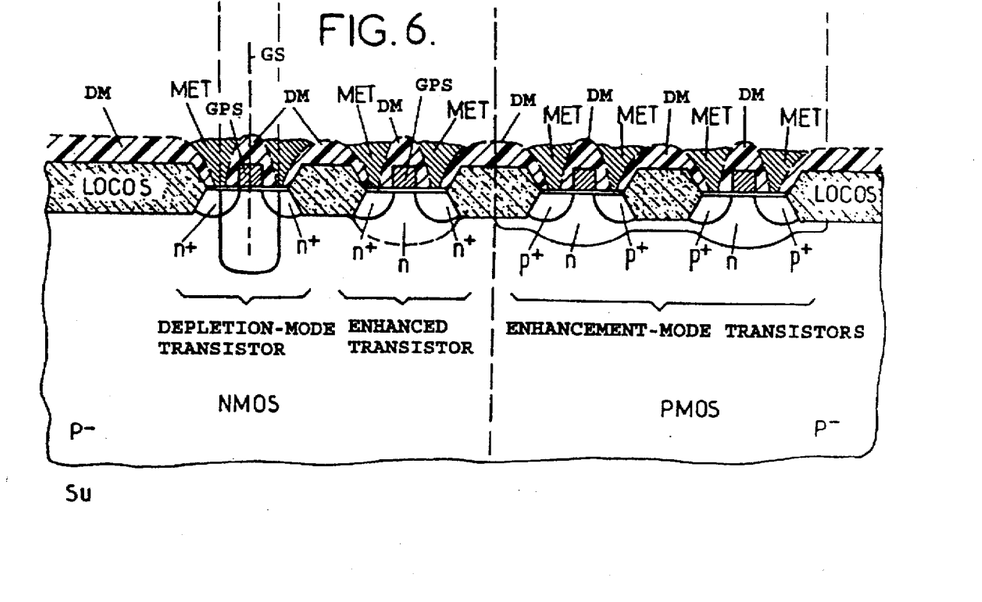

A more detailed description of the structure of a read only memory in MOS technology obtained by implementing the method which is the subject of the present invention, in regard to the NMOS type depletion-mode transistors and PMOS type enhancement-mode transistors, will now be provided in connection with FIGS. 5 and 6.

FIG. 5 represents, in plan view and in succession, a depletion-mode transistor, an enhancement-mode transistor and two enhancement-mode PMOS transistors.

As represented, moreover, in the aforesaid FIG. 6, this figure being represented as sectioned along a sectional plane such as the line AA of FIG. 5, but this time including the PMOS type enhancement-mode transistors intended to constitute the selection transistors, it will be seen that all the depletion-mode programmed MOS transistors and all the selection transistors have, in the aforesaid sectional plane of the substrate, the same implantation profile. Represented in FIG. 6 is the implantation profile of the aforesaid transistors, the n-type retrograde wells of each of the aforesaid transistors having the same implantation profile but being represented in dashed lines as regards the depletion-mode transistors, and in solid or unbroken lines as regards the enhancement-mode PMOS type transistors. The aforesaid dashed and solid line representation has the sole objective of underlining the difference in function between the aforesaid retrograde wells in the cases where the latter relate to a depletion-mode NMOS type transistor, and an enhancement-mode PMOS type transistor, respectively.

As represented in FIG. 6, each depletion-mode programmed transistor has, with respect to a gate symmetry plane, denoted GS (the gate symmetry plane GS being a plane orthogonal to the surface of the substrate separating into two symmetrical parts the gate region GPS made of gate polysilicon material), an implantation region of a conduction type opposite to the conduction type of the substrate, the n-type region represented in the aforesaid FIG. 6. This implantation region is substantially symmetrical with respect to the gate symmetry plane GS. In the implantation region of conduction type opposite to that of the substrate there are also contained, for each respective depletion-mode and enhancement-mode transistor of PMOS type, first and second implantation regions situated in the substrate, between the gate polysilicon region GPS and the LOCOS type adjacent thick silicon oxide regions. The first and second implantation regions are intended to constitute the source and drain regions and are thus placed symmetrically with respect to the gate symmetry plane GS of each respective depletion-mode programmed transistor, and selection transistor. The first and second implantation regions have, for each depletion-mode transistor, a conduction type opposite to that of the substrate and, for each selection transistor, the same conduction type as that of the substrate. The aforesaid implantation region acts as short-circuit between the first and second implantation regions for each depletion-mode transistor and as insulating implantation well in regard to the substrate for each enhancement-mode transistor.

What is claimed is:

1. A method of fabricating a read only memory in MOS technology wherein in said memory an n-bit word is stored by arrays of MOS transistors connected in cascade to a data line, each of said arrays comprising either enhancement-mode or depletion-mode programmed MOS transistors, said method comprising, starting from a silicon substrate of a first conduction type, and subsequent to steps of defining active regions by masking, removing of the mask and providing protective oxidation to produce a protective oxide, the steps of:

a) defining by masking, in said substrate, retrograde wells of the same conduction type as the conduction type of said substrate, b) simultaneously defining, by masking, in said substrate, retrograde wells of a conduction type opposite to the conduction type of said substrate, and depletion-mode transistors, c) removing the protective oxide so as to predefine said enhancement-mode transistors and said depletion-mode transistors, respectively, said method further comprising the steps of providing gate oxide growth, adjusting of threshold voltages of said transistors, using masking to define diffusions of, respectively, the opposite conduction type and the same conduction type as that of the substrate and metallizing connections for said transistors.

2. The method according to claim 1, wherein said steps of defining the retrograde wells are performed by ion implantation of any energy between 300 and 500 keV.

3. The method according to claim 1, wherein the steps (a) of defining retrograde wells of the same conduction type as the conduction type of the substrate, and (b) of defining retrograde wells of a conduction type opposite to that of the substrate and simultaneously defining the depletion-mode transistors, are interchanged.

* * * * *